United States Patent [19]

Tsai et al.

[11] Patent Number: 5,376,623
[45] Date of Patent: Dec. 27, 1994

[54] METHOD TO ENHANCE CRITICAL TEMPERATURE OF THALLIUM-BASED SUPERCONDUCTORS

[75] Inventors: Ming-Jinn Tsai, Hsinchu; Sheng-Feng Wu, Hsin-Chu Hsien; Yao-Tsung Huang, Hsinchu; Ru-Shi Liu, Hsinchu Hsien, all of Taiwan, Prov. of China

[73] Assignee: Industrial Technology Research Institute, Hsinchu, Taiwan, Prov. of China

[21] Appl. No.: 117,497

[22] Filed: Sep. 7, 1993

[51] Int. Cl.$^5$ .................. H01D 12/06; H01L 39/12
[52] U.S. Cl. .................. 505/492; 501/123; 252/518; 423/593; 505/120; 505/121; 505/500; 505/501; 505/742; 505/782
[58] Field of Search .................. 501/123; 505/1, 783; 423/593; 252/518

[56] References Cited

U.S. PATENT DOCUMENTS 5,236,889 8/1993 Sugihara et al. .................. 505/783

FOREIGN PATENT DOCUMENTS 441986 8/1991 European Pat. Off. .
516148 12/1992 European Pat. Off. .

OTHER PUBLICATIONS

Kaneko et al, "Zero-resistance Temperature of Tl-based 2223 superconductor increased to 127 K", Physica C, 178, (1991), 377–382 no month.

Liu et al, "An efficient and reproducible approach for attaining superconductivity at 128 K in $Tl_2Ba_2Ca_2Cu_3O_{10-\delta}$", Physica C 192, (1991), 119–122.

Primary Examiner—Karl Group
Attorney, Agent, or Firm—W. Wayne Liauh

[57] ABSTRACT

Unexpected results were obtained when Tl-1223 and Tl=-2223 superconductive materials were annealed at respectively pre-determined annealing temperatures. The optimum annealing temperatures for Tl-1223 and Tl-2223 superconductive materials are found to be 860° C. and 820° C., respectively. By incorporating the optimum annealing temperature and an optimum annealing environment, which is expressed in terms of oxygen partial pressure, into the manufacturing process, the present invention presents a method which can substantially increase the critical temperature of thallium based superconductive materials with greatly reduced annealing time and with improved reproducibility, and is thus superior to any method disclosed in the prior art.

10 Claims, 4 Drawing Sheets

METHOD TO ENHANCE CRITICAL TEMPERATURE OF THALLIUM-BASED SUPERCONDUCTORS

FIELD OF THE INVENTION

This invention relates a process to enhance the critical temperature of thallium-based superconducting material. More particularly, this invention relates to a process to increase the critical temperatures of $(Tl_{1-x-y}Bi_xPb_y)Ba_2Ca_2Cu_3O_9$ (the Tl-1223 phase compound) and $Tl_2Ba_2Ca_2Cu_3O_{10}$ (the Tl-2223 phase compound) superconducting materials.

BACKGROUND OF THE INVENTION

In 1986, oxides of La—Ba—Cu—O were found to exhibit superconductivity at a critical temperature ($T_c$) as high as 30K. Since then, materials of oxides have drawn public attention as candidates for superconducting material. In 1987, it was confirmed that a series of superconductive oxides of Y—Ba—Cu—O had a critical temperature of about 90K, which is higher than the temperature of liquid nitrogen (77K). In 1988, Bi—Sr—Ca—Cu—O and Tl—Ba—Ca—Cu—O superconductors were discovered with critical temperatures exceeding 100K. Thereafter, many researchers have been able to develop superconductive materials having critical temperatures of at least 120K, such as $Tl_2Ba_2Ca_2Cu_3O_{10}$ (Tl-2223 phase), which has a $T_c$ of about 120K. However, methods of preparing such materials are very delicate that it is always very difficult to prepare a material which exhibits superconductivity at temperatures exceeding 120K with satisfactory reproducibility.

In "Zero-resistance temperature of Tl-based "2223" superconductor increased to 127K," by Kaneko, T., et al., Physica C, 178 (1991) 377-382, it was demonstrated that a single-phase "2223" superconductor, i.e., $Tl_{1.7}Ba_2Ca_{2.3}Cu_3O_z$ exhibits the zero-resistance temperature of 127K and the diamagnetic temperature of 130K, when the sample was encapsulated in an evacuated quartz tube ($\sim 10^{-4}$ Torr) and postannealed at 750° C. for 250 hours.

In "Superconductivity at 124K in (Tl, Pb)Sr$_2$Ca$_2$Cu$_3$O$_9$," by Liu, R. S., et al., Physica C, 198 (1992) 318-322, it was reported that an almost pure phase (Tl$_{0.5}$Pb$_{0.5}$)Sr$_2$Ca$_2$Cu$_3$O$_9$ (Tl-1223 phase) can be prepared which exhibits a critical temperature of 124K by encapsulating in gold foil and sintered at 950° C. for three hours in oxygen, then sealed in an evacuated quartz tube and finally annealed at 700°~750° C. in an evacuated quartz tube (oxygen partial pressure $\sim 10^{-4}$ Torr) for 5~10 days.

In "An efficient and reproducibility approach for attaining superconductivity at 128K in Tl$_2$Ba$_2$Ca$_2$Cu$_3$O$_{10-\delta}$," by Liu, R. S., et al., Physica C, 182 (1991) 119-122, it was reported a method for the preparation of almost single phase Tl-2223, which is characterized by high temperature superconductivity with $T_{c,mid-point} = 128K$ and $T_{c,zero} = 126K$. The procedure involves synthesizing a material with a nominal stoichiometry Tl$_{1.6}$Ba$_2$Ca$_{2.4}$Cu$_3$O$_{10-\delta}$, which was sintered at 910° C. for three hours, annealed at 750° C. in an evacuated quartz tube for 10 days, and finally annealed at 600° C. in a 0.2% oxygen/nitrogen environment for two hours.

Eur. Pat. App. No. 0 516 148 A2, which corresponds to Japanese Pat. App. No. JP 127939/91, filed May 30, 1991, discloses an oxide superconductive material having the following formula:

$$Tl_xBa_2Ca_yCu_3O_z$$

wherein x, y and z are in relations satisfying $1.5 \leq x \leq 2.0$, $2.0 \leq y \leq 2.5$, $x+Y=4.0$, $9.0 \leq z \leq 11.0$. The process of preparing the superconductive material include the steps of placing a mixed powder in an oxygen jet to obtain a sintered body, and annealing the sintered body in a closed atmosphere at 700° to 800° C. for up to 500 hours.

Eur Pat. App. No. 0 441 986 A1, which corresponds collectively to Japanese Pat. App. Nos. JP 230876/89, filed May 9, 1989, JP 252830/89, filed Sep. 27, 1989, JP 282700/89, filed Oct. 30, 1989, and JP 81834/90, filed Mar. 29, 1990) discloses an oxide superconductive material characterized by having a crystalline phase comprising oxides of the following formula:

$$Tl_xPb_yBi_zSr_2Ca_yCu_3O_r$$

wherein x, y, and z are numbers satisfying the following condition:

$x+y+z=1$
$0.3 \leq x \leq 0.95$
$0 \leq y \leq 0.5$
$0.05 \leq z \leq 0.4$ and r is a number of approximately 9. The process of preparing the superconductive material include the steps of calcining a mixed powder at 850° C. for 10 hours in oxygen atmosphere, pressing the mixed powder into a mold, sintering the mold at 900°–950° C. for 20 hours, and annealing the sintered product at three cascadingly lower temperatures for an aggregate of 60 hours. The superconductive material of oxides exhibit a critical temperature between 90 and 120K.

In the preparation of thallium-bases superconductive materials, it is well-known that the thallium atoms often escape from the powder mixture at elevated temperatures. In order to prevent a possible decomposition resulting from excess loss of thallium, it is always desirable to avoid prolonged heat treatment of the superconductive composition at elevated temperatures. Conventionally, during the annealing step, the superconductive material is sealed inside an evacuated quartz tube ($\sim 10^{-4}$ Torr) and annealed at a relatively low temperature of 750° C. for an extended period of time, at least 200~250 hours. Such a long annealing time, however, will result in a weight loss of the superconductive material. It has been observed that the walls of the quartz tube often became foggy during or after the annealing step. This is due to the fact that thallium and/or oxygen can escape from the reactants in the form of thallium or thallium oxide vapor, which would react with the quartz tube or diffuse therethrough. Furthermore, even with such a prolonged annealing process, prior techniques are only able to increase the critical temperatures of Tl-1223 and Tl-2223 to 120K and 125K, respectively. It is therefore, desirable to develop a process which would allow thallium based superconductive materials, more particularly, Tl-1223 and Tl-2223, to be prepared without having to subject the same to such a prolonged annealing time.

SUMMARY OF THE INVENTION

Having discussed the main shortcomings of the prior art techniques in the manufacturing of thallium based superconductive materials, the primary object of the present invention, therefore, is to develop a technique which could enhance, or increase, the critical temperature of thallium based superconductive materials with improved reproducibility and without the requirement of a prolonged annealing time.

The process disclosed in the present invention is the fruit of many years of laboratory research by the co-inventors which was aimed at increasing the critical temperature of thallium based superconducting materials, improving the reproducibility of the reaction products, reducing the manufacturing time, and improving the process efficiency and thus the cost of making the thallium based superconductive materials.

In accordance with a preferred embodiment of the present invention, a crystalline phase comprised of oxides represented by the chemical composition $(Tl_{0.6}Pb_{0.2}Bi_{0.2})Sr_{1.6}Ca_{2.4}Cu_3O_x$, was prepared by accurately weighing appropriate oxides and carbonates of high purity in appropriate proportions and sintering the solid mixture to effectuate a solid phase reaction. The superconductive material is primarily a Tl-1223 phase with some impurities. After sintering, the sintered product was annealed using a procedure disclosed in the present invention: annealing at 800°~880° C. for 15~20 hours at an oxygen partial pressure of about 0.01~100 atm. Best result was obtained when the Ti-1223 superconductive material was annealed at 860° C.

In another preferred embodiment of the present invention, a crystalline phase comprised of oxides represented by the chemical composition $Tl_{1.7}Ca_{2.3}Ba_2Cu_3O_y$, was prepared by accurately weighing appropriate oxides and carbonates of high purity in appropriate proportions and sintering the solid mixture to effectuate a solid phase reaction. The superconductive material is primarily a Tl-2223 phase with some impurities. After sintering, the sintered product was annealed using a procedure disclosed in the present invention: annealing at 800°~850° C. for 10~20 hours at an oxygen partial pressure of about 0.01~1.0 atm. The optimum annealing temperature was found to be 820° C. for the Tl-2223 superconductive material.

In both of the two preferred embodiments described above, if the annealing is done at an oxygen partial pressure less than 1 atm ($P_0 < 1$ atm), the superconductive material should be sealed in a quartz tube having a volume less than 10 cm$^3$. On the other hand, if a high pressure ($P_0 \geq 1$ atm) annealing procedure is used, the annealing is done in a high pressure oxygen furnace. In both cases, the superconductive material should be wrapped in a gold foil to prevent an excessive loss of thallium and avoid direct contact between the superconductive material with either the furnace tube or quartz tube. In determining weight loss, the superconductive materials are weighed immediately before and after the heat treatment to eliminate any error due to the absorption of moisture.

BRIEF DESCRIPTION OF THE DRAWINGS

The present invention will be described in detail with reference to drawings showing the preferred embodiment of the present invention, wherein.

DETAILED DESCRIPTION OF THE INVENTION

The present invention will now be described more specifically with reference to the following examples. It is to be noted that the following descriptions of examples including preferred embodiments of this invention are presented herein for purpose of illustration and description; it is not intended to be exhaustive or to limit the invention to the precise form disclosed.

EXAMPLE 1

High purity powders of $SrCO_3$, $CaCO_3$, and $CuO$ in appropriate proportions were thoroughly mixed and calcined at 940° C. to form a SrCaCuO precursor. The precursor was then crushed and into which $Tl_2O_3$, $PbO$ and $Bi_2O_3$, also in appropriate proportions, were added to form a powdery mixture. The proportions of the starting materials were calculated and weighed so that the ratio of atoms in the final mixture attained a value of Tl:Pb:Bi:Sr:Ca:Cu=0.6:0.2:0.2:1.6:2,4:3. The powdery mixture was pressed into a desirable shape, typically into a pellet. The pellet was wrapped into a gold foil (to prevent the loss of thallium as stated earlier) and sintered in an oxygen environment at a sintering temperature of about 900°~920° C. for 3~6 hours. The sintered product exhibited primarily a Tl-1223 phase and contained small amounts of impurities such as CuO, $Ca_2CuO_3$ and $Ca_2Pb_4$. It exhibited a superconductivity temperature of 115K.

Figure 1:
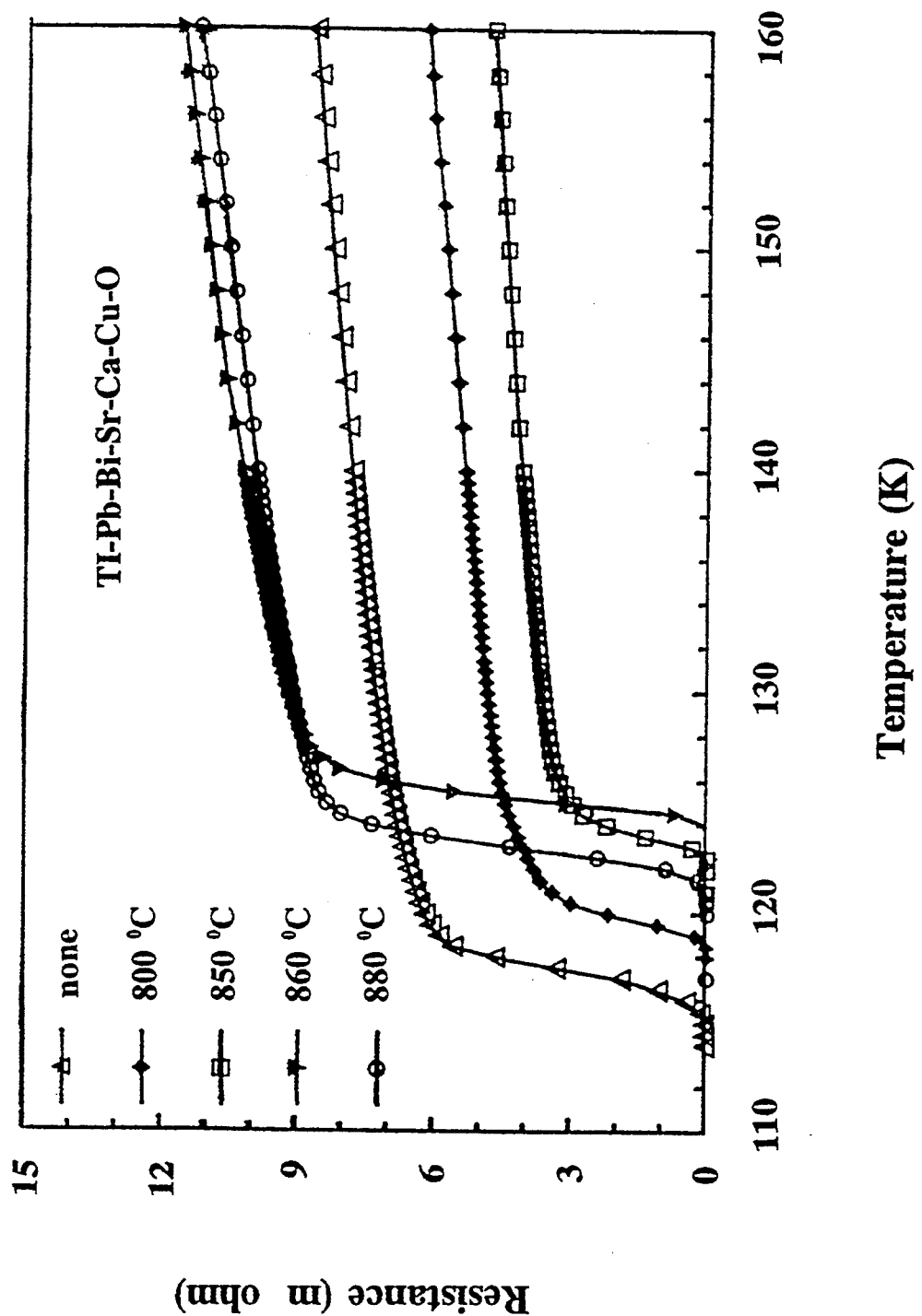
FIG. 1 illustrates the resistance-temperature relationship for a Tl—Pb—Bi—Sr—Ca—Cu—O compound after being annealed for twenty hours at various annealing temperatures.

In one set of annealing treatments, the superconductive material obtained from above procedure was wrapped in a gold foil and annealed at 800° C.~880° C. under an oxygen environment. Electrical resistances of the superconductive materials annealed at various temperatures and a superconductive material which was unannealed, were measured over a range of temperatures from 110K to 160K, and the results are shown in FIG. 1. FIG. 1 indicates that the superconductive material annealed at 860° C. exhibited the highest critical temperature $T_c = 124K$. FIG. 1 also shows that the critical temperature of the annealed product first increased with the annealing temperature, until it reached an optimum annealing temperature of 860° C. Above 860° C., the critical temperature of the annealed superconductive material decreased with increased annealing temperature. FIG. 1 clearly manifests the existence of an optimum annealing temperature for the enhancement of the critical temperature of a superconductive material.

Figure 2:
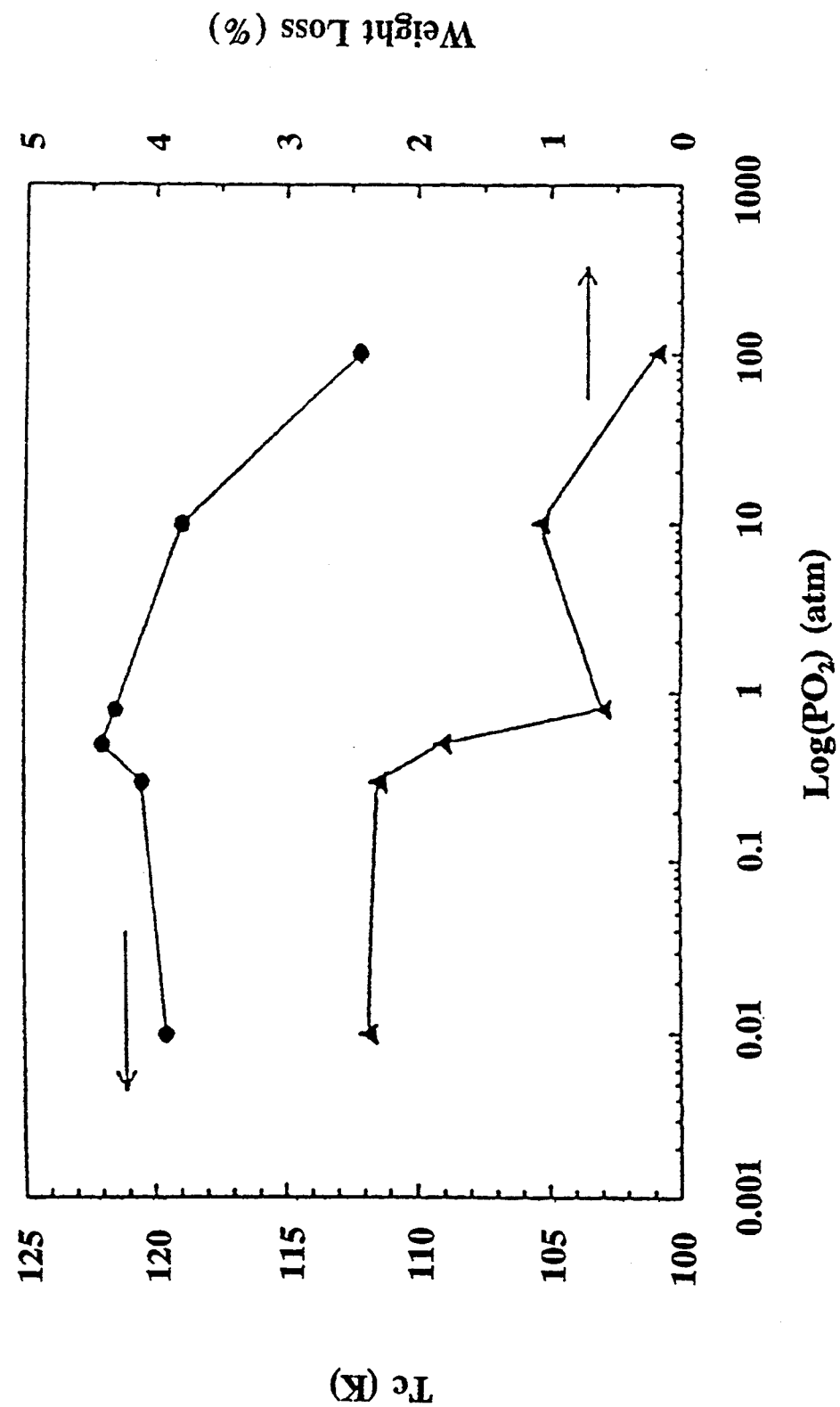
FIG. 2 illustrates the critical temperature-oxygen partial pressure and weight loss-oxygen partial pressure relationships for a Tl—Pb—Bi—Sr—Ca—Cu—O compound after being annealed for twenty hours at an annealing temperature of 860° C. and at various oxygen partial pressures (the annealing time was two hours when the sintered compound was annealed at an oxygen partial pressure of 100 atm).

In another set of annealing treatments, the superconductive material was placed either inside a quartz tube with the partial pressure of oxygen therein controlled at 0.01~1 atm, or in a high pressure oxygen furnace (with an oxygen partial pressure of 1~100 atm), and annealed at an annealing temperature of 860° C. for 2~20 hours. The weight loss and critical temperature of the superconductive material at the above ranged oxygen partial pressures are plotted in FIG. 2. In FIG. 2, it is shown that, for the Tl-1223 superconductive material, its critical temperature increased with oxygen pressure when $PO_2 \leqq 0.5$ atm. At $PO_2 = 0.5$ atm, the annealed Tl-1223 superconductive material attained the maximum critical temperature, 124K. At $PO_2 > 0.5$ atm, the critical temperature of the annealed Tl-1223 superconductive material decreased with the increase in the oxygen partial pressure of the annealing environment, possibly due to the decomposition of the superconductive material. The extent of decomposition appeared to be most severe at $PO_2 = 100$ atm, which corresponded to the lowest critical temperature. FIG. 2 also shows that the extent of weight loss increased with the decrease in oxygen partial pressure. This was observed under the low pressure annealing condition in a quartz tube as well as under the high pressure annealing condition in a pressurized container.

EXAMPLE 2

High purity powders of $Tl_2O_3$, $BaO_2$, CaO, and CuO in appropriate proportions corresponding to a atomic ratio of Tl:Ca:Ba:Cu=1.6:2.4:2:3 were thoroughly mixed and pressed into pellets, which were then wrapped in gold foil and sintered in an oxygen environment at 910° C. for three hours. The sintered product exhibited primarily the Tl-2223 phase and contained small amounts of impurities such as CuO, $Ca_2CuO_3$ and. It exhibited a superconductivity temperature of 120K.

Figure 3A:
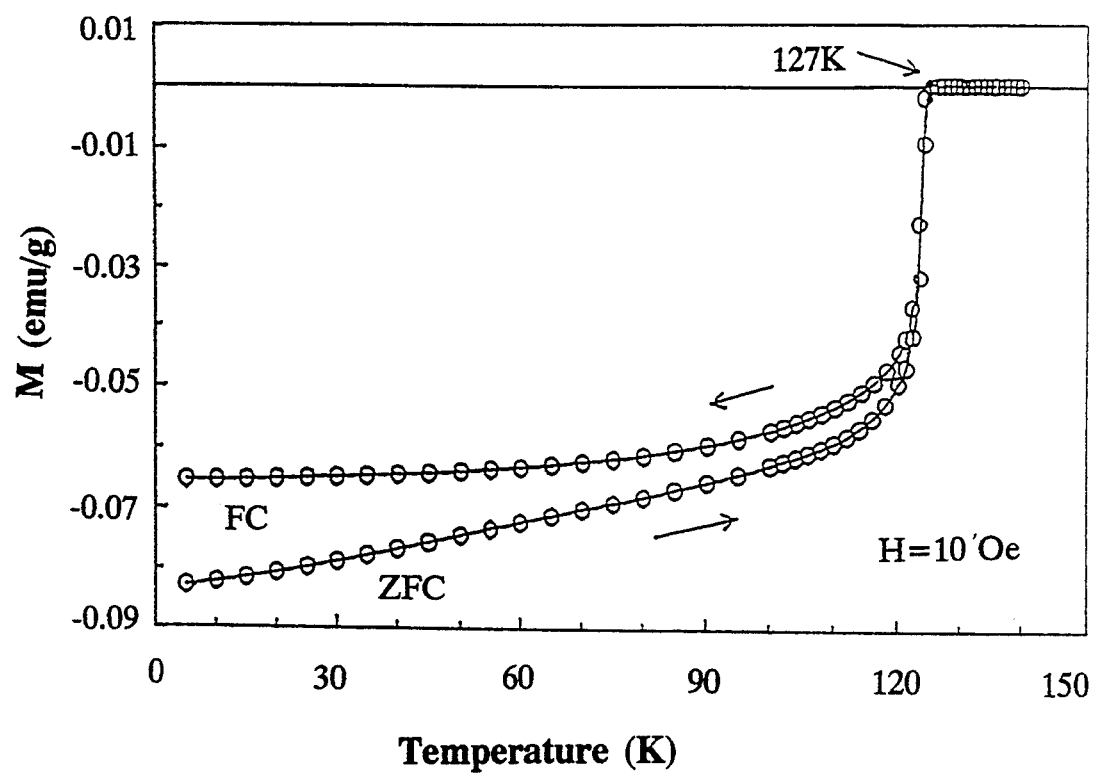
FIG. 3 illustrates the magnetization-temperature and resistance-temperature relationships for a Tl—Ca—Ba—Cu—O compound after being annealed for 16 hours in oxygen flowing environment at 820° C.
Figure 3B:
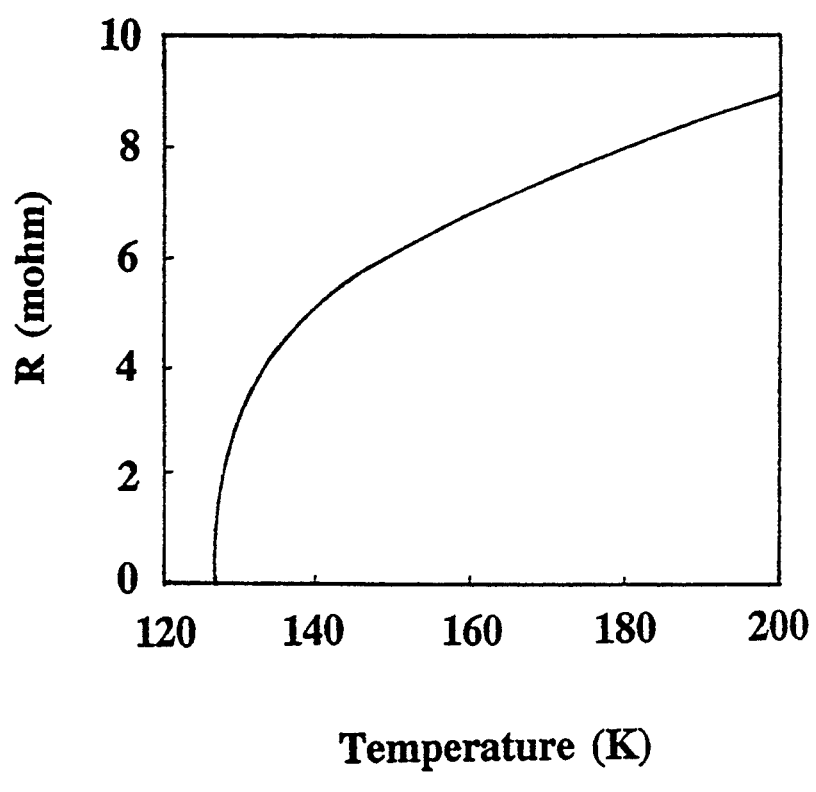

In one set of tests, the superconductive material obtained from above was annealed in an oxygen environment and at an annealing temperature of 820° C. for sixteen hours. The annealed superconductive material exhibited a critical temperature $T_c$ of 127K, as shown in FIG. 3, based on either electrical resistance or magnetization measurements. The annealed superconductive material exhibited a single Tl-2223 phase with high purity.

In another set of tests, the superconductive material was sealed inside a quartz tube and annealed at an annealing temperature of about 820° C. for 16 hours. The oxygen partial pressure in the quartz tube was controlled at 0.01~0.8 atm. The relationship between the critical temperature $T_c$ of the annealed superconductive material and the oxygen partial pressure is shown below:

| $PO_2$ (atm) | unannealed | ~0.01 | 0.3 | 0.5 | 0.8 |
| --- | --- | --- | --- | --- | --- |
| $T_c$ (K) | 121.0 | 126.6 | 127.6 | 125.6 | 124.0 |

The above table clearly manifests that annealing in a quartz tube at a reduced pressure can significantly increase the critical temperature of the superconductive material. However, best results were obtained at an annealing temperature of 820° C. and an oxygen partial pressure $PO_2 = 0.3$ atm. At greater or lower oxygen partial pressure, the critical temperature of the superconductive material was lower than that annealed at the optimum condition.

In either Example 1 or Example 2, no reaction between the superconductive material and the gold foil was observed. However, in the annealing of Tl-2223 in Example 2, the walls of the quartz tube became foggy due to reactions between the escaped gas and the quartz tube. Some decomposition of the superconductive material was observed as a result of the annealing procedure. Decomposition was most noticeable at extremely low or extreme high oxygen partial pressure conditions. The relative amounts of impurities such as $CaCuO_3$ and CuO became amplified as a result of thallium loss.

The method disclosed in the present invention presents several distinct advantages over those of the prior art. Most significantly, the present invention was able to enhance the critical temperature of thallium based superconductive materials by about 7K with an annealing time of less than one day. On comparison, ten or more days would be required using the prior art methods; and the prior art method could only increase the critical temperature by about 5K. The method disclosed in the present invention not only is a time-saving technique, it also provide an efficient, easy to operate and highly reproducible process to manufacture superconductive materials of improved critical temperatures.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for increasing critical temperature of thallium based superconductive materials comprising the steps of:
    (a) preparing a SrCaCuO precursor by mixing powders of $SrCO_3$, $CaCO_3$, and CuO in appropriate proportions and calcining said powder mixture at 940° C. for about 20 hours;
    (b) forming a powder mixture by mixing said SrCaCuO precursor with $Tl_2O_3$, PbO and $Bi_2O_3$ powders, in appropriate proportions such that the atoms of said powder mixture attaining a ratio of Tl:Pb:Bi:Sr:Ca:Cu=0.6:0.2:0.2:1.6:2.4:3;
    (c) forming a sintered TlPbBiSrCaCuO superconductive material by pressing said powder mixture into a pellet, wrapping said superconductive pellet inside a gold foil, and sintering said gold foil wrapped pellet in an oxygen environment at a sintering temperature of about 900° C. to 920° C. for 3 to 6 hours; and
    (d) annealing said sintered TlPbBiSrCaCuO superconductive material at an annealing temperature of 860° C. at an oxygen partial pressure of 0.01 to 100 atm for 2 to 20 hours.

2. The method for increasing critical temperature of thallium based superconductive material according to claim 1 wherein said sintered TlPbBiSrCaCuO superconductive material is annealed by the following substeps:
    (a) wrapping said sintered superconductive material in a gold foil;
    (b) sealing said sintered superconductive material in a quartz tube, wherein said quartz tube is maintained at an oxygen partial of between 0.01 and 1 atm; and
    (c) annealing said sintered superconductive at 860° C. for an annealing time of 2 to 20 hours.

3. The method for increasing critical temperature of thallium based superconductive material according to claim 2 wherein said annealing time is 20 hours.

4. The method for increasing critical temperature of thallium based superconductive material according to claim 1 wherein said sintered TlPbBiSrCaCuO superconductive material is annealed by placing said superconductive material in a flowing oxygen furnace at an annealing temperature of 860° C. for an annealing time of 2 to 20 hours, said oxygen furnace having an oxygen partial pressure of between 1 and 100 atm.

5. The method for increasing critical temperature of thallium based superconductive material according to claim 4 wherein said annealing time is 20 hours.

6. A method for increasing critical temperature of thallium based superconductive material comprising the steps of:
  (a) preparing a powder mixture by mixing powders of $Tl_2O_3$, CaO, $BaO_2$, and CuO in appropriate proportions such that the atoms of said powder mixture attaining a ratio of Tl:Ca:Ba:Cu=1.6:2.4:2:3;
  (b) forming a sintered superconductive material by pressing said powder mixture from step (a) into a pellet, wrapping said pellet inside a gold foil, and sintering said gold foil wrapped pellet in an oxygen environment at a sintering temperature of about 910° C. for 3 hours; and
  (d) annealing said sintered superconductive material from step (b) at an annealing temperature of about 800° C. to 850° C. and an oxygen partial pressure of 0.01 to 0.8 atm for 10 to 20 hours.

7. The method for increasing critical temperature of thallium based superconductive material according to claim 6 wherein said sintered superconductive material is annealed at an annealing temperature of about 820° C. for 16 hours.

8. The method for increasing critical temperature of thallium based superconductive material according to claim 6 wherein said sintered superconductive material is annealed at an annealing temperature of about 820 and an oxygen partial pressure of 0.3 atm for 16 hours.

9. A thallium based superconductive material having enhanced critical temperature through an annealing process, said thallium based superconductive material being prepared by a process comprising the steps of:
  (a) preparing a SrCaCuO precursor by mixing powders of $SrCO_3$, $CaCO_3$, and CuO in appropriate proportions and calcining said powder mixture at 940° C. for about 20 hours;
  (b) forming a powder mixture by mixing said SrCaCuO precursor with $Tl_2O_3$, PbO and $Bi_2O_3$ powders, in appropriate proportions such that the atoms of said powder mixture attaining a ratio of Tl:Pb:Bi:Sr:Ca:Cu=0.6:0.2:0.2:1.6:2.4:3;
  (c) forming a sintered TlPbBiSrCaCuO superconductive material by pressing said powder mixture into a pellet, wrapping said superconductive pellet inside a gold foil, and sintering said gold foil wrapped pellet in an oxygen environment at a sintering temperature of about 900° C. to 920° C. for 3 to 6 hours; and
  (d) annealing said sintered TlPbBiSrCaCuO superconductive material at an annealing temperature of 860° C. at an oxygen partial pressure of 0.01 to 100 atm for 2 to 20 hours.

10. The thallium based superconductive material according to claim 9 which has a critical temperature of about 124K.

* * * * *